(12) United States Patent
Chen et al.

(10) Patent No.: US 6,849,907 B2
(45) Date of Patent: Feb. 1, 2005

(54) ELECTROSTATIC DISCHARGE PROTECTION DEVICE

(75) Inventors: Tung-Yang Chen, Hsinchu (TW); Tien-Hao Tang, Taipei Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 10/640,437

(22) Filed: Aug. 12, 2003

(65) Prior Publication Data

US 2004/0031998 A1 Feb. 19, 2004

Related U.S. Application Data

(63) Continuation-in-part of application No. 10/141,910, filed on May 9, 2002, now Pat. No. 6,621,133.

(51) Int. Cl.[7] ............................................. H01L 29/94
(52) U.S. Cl. ..................... 257/409; 257/350; 257/355; 257/372
(58) Field of Search ................ 257/409, 350, 257/355, 372

(56) References Cited

U.S. PATENT DOCUMENTS 5,744,842 A * 4/1998 Ker ............................ 257/362
6,274,909 B1 * 8/2001 Chang et al. ................ 257/355
6,420,221 B1 * 7/2002 Lee et al. .................... 438/199
6,469,354 B1 * 10/2002 Hirata ......................... 257/358
6,621,133 B1 * 9/2003 Chen et al. .................. 257/409

* cited by examiner

Primary Examiner—David Nelms
Assistant Examiner—Tu-Tu Ho
(74) Attorney, Agent, or Firm—J.C. Patents

(57) ABSTRACT

An electrostatic discharge (ESD) protection device. The ESD protection device includes a first parasitic bipolar transistor, a second parasitic bipolar transistor, a third parasitic bipolar transistor and a fourth parasitic bipolar transistor formed over a substrate. A first longitudinal doped region is formed between the first parasitic bipolar transistor and the second parasitic bipolar transistor. Similarly, a second longitudinal doped region is formed between the third parasitic bipolar transistor and the fourth parasitic bipolar transistor. A guard ring circumscribes the substrate. An isolation region is formed inside the guard ring. All collectors of the parasitic bipolar transistors are connected to an anode terminal. The guard ring, the first/second longitudinal doped regions and all emitters of the parasitic bipolar transistors are connected to a cathode terminal.

12 Claims, 9 Drawing Sheets

ELECTROSTATIC DISCHARGE PROTECTION DEVICE

CROSS-REFERENCE TO RELATED APPLICATION

This application is a continuation-in-part application of U.S. application Ser. No. 10/141,910 filed on May 9, 2002, now U.S. Pat. No. 6,621,133

BACKGROUND OF THE INVENTION

1. Field of Invention

The present invention relates to an electrostatic discharge protection (ESD) device. More particularly, the present invention relates to an electrostatic discharge protection device fabricated through a complementary metal-oxide-semiconductor (CMOS) process that can be uniformly triggered during an electrostatic discharge.

2. Description of Related Art

Electrostatic discharge is a phenomenon triggered by movement of static charges along a non-conducting surface. In general, an electrostatic discharge may produce serious damages to the semiconductors and other circuit components inside an integrated circuit. People walking on a carpet may generate a few hundred to a few thousand volts of static electricity even if the surrounding atmosphere has a high relative humidity. If the surrounding relative humidity is low, a static electricity up to ten thousand or more volts may be produced. Integrated circuit packaging machines or integrated circuit testing equipment may also generate static electricity from several hundred to several thousand volts too. When a charged body (such as the human body, machine or equipment) touches a silicon chip, static charges may discharge through the chip. The power produced by such transient electrostatic discharge may permanently damage the circuits inside the chip or render a loss in function of some of the devices.

To prevent damage to integrated circuits due to electrostatic discharge, various types of electrostatic discharge protection devices are introduced.

FIG. 1 is a top view showing a conventional electrostatic discharge protection device. FIG. 2 is a cross-sectional view along line I–I' of FIG. 1. As shown in FIGS. 1 and 2, the conventional electrostatic discharge (ESD) protection device has a multi-finger structure. The ESD protection device is formed on a P-type substrate 10. The device comprises a metal-oxide-semiconductor (MOS) transistor region 100, a guard ring 30 and a shallow trench isolation (STI) region 32.

The MOS transistor region 100 accommodates a plurality of N-type metal-oxide-semiconductor (NMOS) transistors that includes a plurality of gate structures 12, 14, 16, 18 as well as a plurality of source terminals 20, 24, 28 and a plurality of drain terminals 22, 26 in the substrate 10 on each side of the gate structures 12, 14, 16 and 18. The source terminal 20 is the emitter of a parasitic bipolar junction transistor (parasitic BJT) 110 and the drain terminal 22 is the collector of the parasitic BJT 100. The substrate 10 between the source terminal 20 and the drain terminal 22 is the base of the parasitic BJT 110. The source terminal 24 is the emitter of a parasitic bipolar junction transistor 112 and the drain terminal 24 is the collector of the parasitic BJT 112. The substrate 10 between the source terminal 24 and the drain terminal 22 is the base of the parasitic BJT 112. The source terminal 24 is the emitter of a parasitic bipolar junction transistor 114 and the drain terminal 26 is the collector of the parasitic BJT 114. The substrate 10 between the source terminal 24 and the drain terminal 26 is the base of the parasitic BJT 114. Similarly, the source terminal 28 is the emitter of a parasitic bipolar junction transistor 116 and the drain terminal 26 is the collector of the parasitic BJT 116. The substrate 10 between the source terminal 28 and the drain terminal 26 is the base of the parasitic BJT 116.

The guard ring 30 is a circumscribing P+-doped region around the substrate 10. The guard ring 30 is connected to a ground (not shown). The guard ring 30 is isolated from the MOS transistor region 100 through shallow trench isolation (STI) regions 32. The source terminals 20, 24, 28 are also connected to the ground. The drain terminals 22 and 26 are connected to an input terminal (not shown).

However, for this type of ESD protection device, the device may be triggered non-uniformly during an electrostatic discharge. In other words, the parasitic BJTs 112, 114 near the central portion of the device may be turned on before the other parasitic BJTs 110 and 116. This occurs because the equivalent resistance of the base terminal for each of the parasitic transistors 110, 112, 114 and 116 may be different. That means, the parasitic BJTs 112 and 114 near the central portion of the device have a higher equivalent base resistance and hence open more readily. The two parasitic BJTs 110 and 116 on each side of the device have to open later due to a lower equivalent base resistance. In general, a BJT having a larger opening area has a higher electrostatic discharge capacity. Since the region having the maximum opening lies in the central portion of a conventional ESD protection device, such uneven opening across the device often leads to a drop in ESD capacity. ESD protection capacity is particularly compromised if the device occupies a large surface area.

To switch on all the parasitic BJTs within an ESD protection device concurrently, a number of improvements to the structure of the ESD protection device have been introduced. FIG. 3 is a top view of a conventional electrostatic discharge protection device having an improved structure for countering non-uniform switching of parasitic devices. FIG. 4 is a cross-sectional view along line II–II' of FIG. 3.

As shown in FIGS. 3 and 4, the device includes a metal-oxide-semiconductor (MOS) transistor region 100, a guard ring 30, a shallow trench isolation (STI) region 32 and a longitudinal P+-doped region 30a over a P-type substrate 10. The gate terminals 12, 14, 16, 18, the source terminals 20, 24, 28 and the drain terminals 22, 26 have been described with reference to FIGS. 1 and 2 and hence their description is omitted.

In this device, aside from having the guard ring 30 circumscribing the substrate 10, a longitudinal P+-doped region 30a is inserted into the mid-section of the source terminal 24. Hence, the source terminal 24 is divided into two source terminals, 24a and 24b. In addition, the STI region 32 is positioned at each end of the substrate 10 isolating the guard ring 30 from the MOS transistor region 100.

The design of this type of ESD protection device relies on connecting all the source terminals 20, 24a, 24b and 26 of the MOS transistors within the device with a ground (the guard ring 30 and the longitudinal P+-doped region 30a). Thus, all the parasitic BJTs 110, 112, 114, 116 within the ESD protection device are triggered concurrently to produce an optimal discharging effect. Nevertheless, in deep sub-micron fabrication, design of the longitudinal P+-doped region 30a lowers the base resistance of the parasitic BJTs 110, 112, 114, 116 so that the parasitic BJTs 110, 112, 114 and 116 are difficult to trigger hence reducing ESD capacity of the device.

In addition, the concentration of dopants in P-type and N-type wells will increase when integrated circuits are fabricated in the deep sub-micron regime. Since the equivalent base resistance of the parasitic BJTs within the ESD protection device is dependent on the resistance in the well region, triggering of the parasitic BJTs is increasingly difficult. Although the aforementioned method is capable of improving non-uniform triggering of parasitic BJTs, difficult triggering of the ESD protection device compromises its protective capacity.

Another method of improving non-uniform switching of a conventional ESD protection device is to set up special electronic circuits. Gate driven or substrate-triggered circuits are sometimes incorporated into the ESD protection device, but this type of design requires additional circuit layout leading to greater circuit complexity as well as an increase in production cost.

SUMMARY OF THE INVENTION

Accordingly, one object of the present invention is to provide an electrostatic discharge (ESD) protection device capable of switching internal parasitic bipolar transistors on concurrently during an electrostatic discharge.

A second object of this invention is to provide an electrostatic discharge protection device capable of sustaining an electrostatic discharge a little longer.

A third object of this invention is to provide an electrostatic discharge protection device that has an improved circuit protection capacity without any increase in circuit complexity and production cost.

To achieve these and other advantages and in accordance with the purpose of the invention, as embodied and broadly described herein, the invention provides an electrostatic discharge protection device. The device includes a metal-oxide-semiconductor (MOS) transistor region, a guard ring, an isolation region, a first longitudinal doped region and a second longitudinal doped region on a substrate. The guard ring circumscribes the substrate. The isolation region is inside the guard ring for isolating the devices within the MOS transistor region from the guard ring. The MOS transistor region further includes at least a first MOS transistor, at least a second MOS transistor, at least a third MOS transistor and at least a fourth MOS transistor. The first longitudinal doped region is between the drain terminal of the first MOS transistor and the drain terminal of the second MOS transistor. The first longitudinal doped region, the drain terminal of the first MOS transistor and the drain terminal of the second MOS transistor are isolated from each other by isolation regions. The second longitudinal doped region is between the drain terminal of the third MOS transistor and the drain terminal of the fourth MOS transistor. The second longitudinal doped region, the drain terminal of the third MOS transistor and the drain terminal of the fourth MOS transistor are isolated from each other by isolation regions. The first longitudinal doped region, the second longitudinal doped region, the guard ring, the source terminal of each MOS transistor are all connected to a cathode terminal while the drain terminal of each MOS transistor is connected to an anode terminal.

To provide a better electrostatic discharge protection capacity, this invention further includes a well. The well is formed within the source terminal of the first/fourth MOS transistor on each side of the substrate and adjacent isolation region and the substrate underneath the adjacent isolation region. Similarly, the well may also be formed in the drain terminal of the first MOS transistor and the substrate underneath the adjacent isolation region, in the drain terminal of the second MOS transistor and the substrate underneath the adjacent isolation region, in the drain terminal of the third MOS transistor and the substrate underneath the adjacent isolation region and in the drain terminal of the fourth MOS transistor and the substrate underneath the adjacent isolation region. The well may also be formed in all of the aforementioned areas.

The ESD protection device according to this invention has a longitudinal doped region within the drain terminal of the MOS transistor, and the longitudinal doped region and the source terminal MOS transistor are connected to a cathode terminal. Hence, the base resistance of the parasitic bipolar transistor of each MOS transistor can be increased and has equal switching power.

The ESD protection device has a longitudinal doped region inside the drain terminal of the MOS transistor and deep well in the appropriate region, wherein the longitudinal doped region and the source terminal MOS transistor are connected to a cathode terminal. Hence, the parasitic bipolar transistor of each MOS transistor has an identical and improved switching capability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
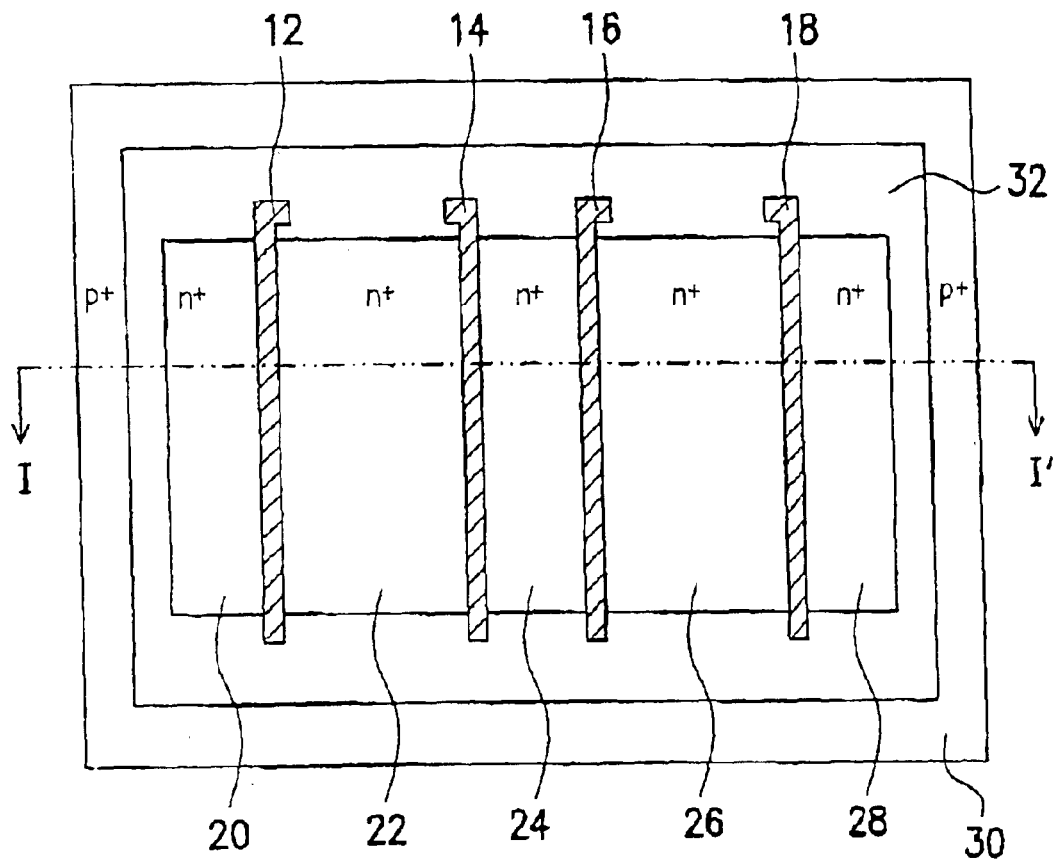
FIG. 1 is a top view showing a conventional electrostatic discharge protection device.

Reference will now be made in detail to the present preferred embodiments of the invention, examples of which are illustrated in the accompanying drawings. Wherever possible, the same reference numbers are used in the drawings and the description to refer to the same or like parts.

Figure 5:
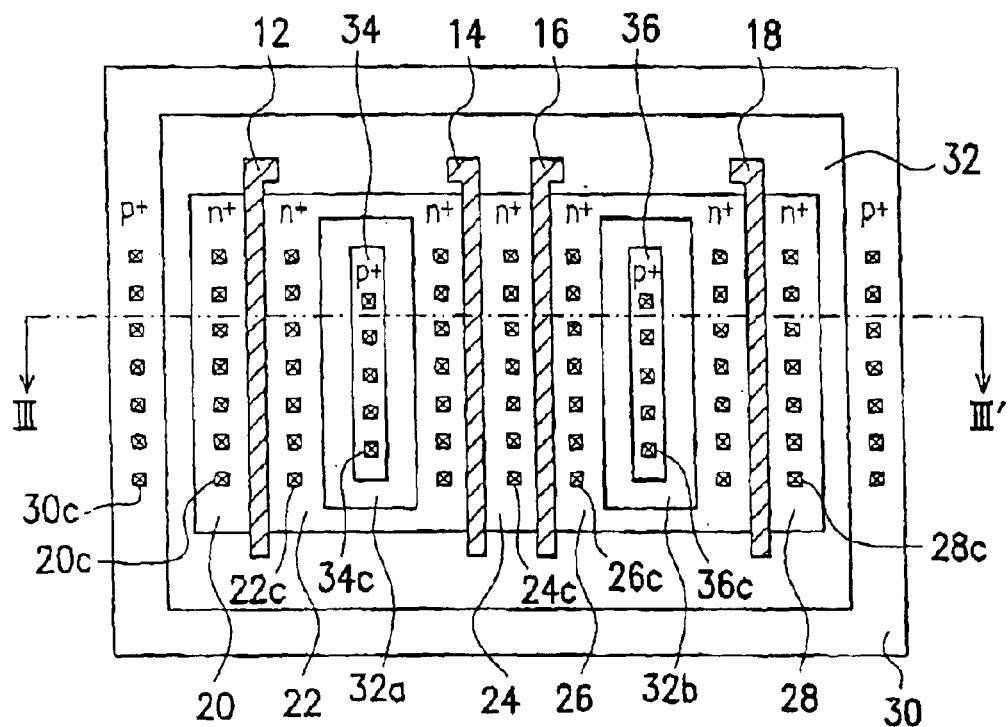
FIG. 5 is a top view showing an electrostatic discharge protection device fabricated according to a first embodiment of this invention.
Figure 6:
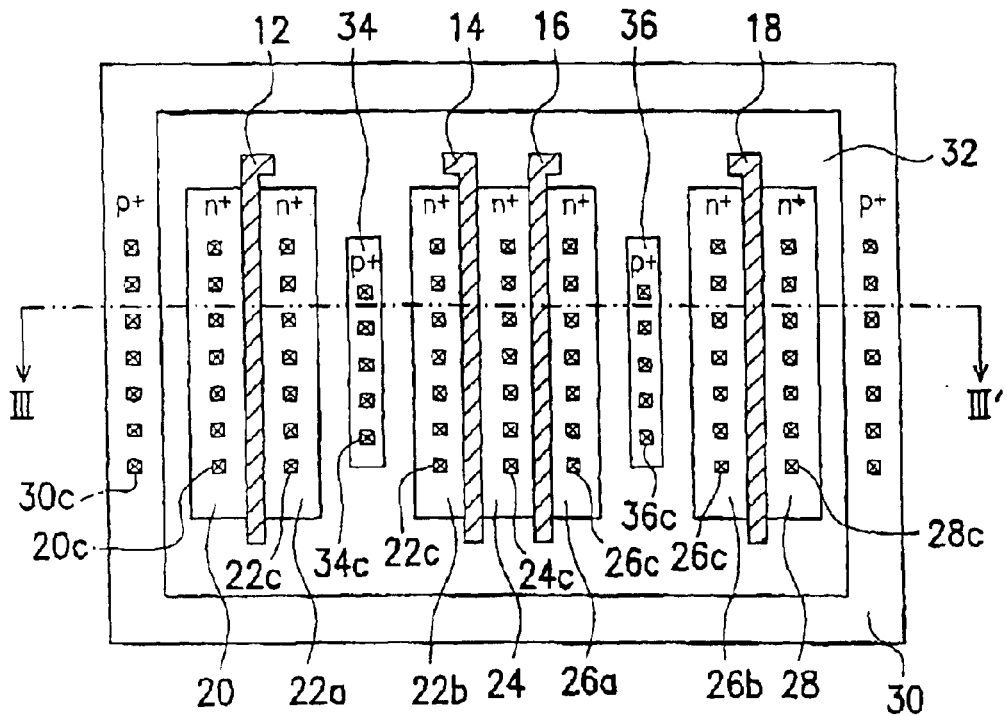
FIG. 6 is a top view showing an alternative electrostatic discharge protection device fabricated according the first embodiment of this invention.
Figure 7:
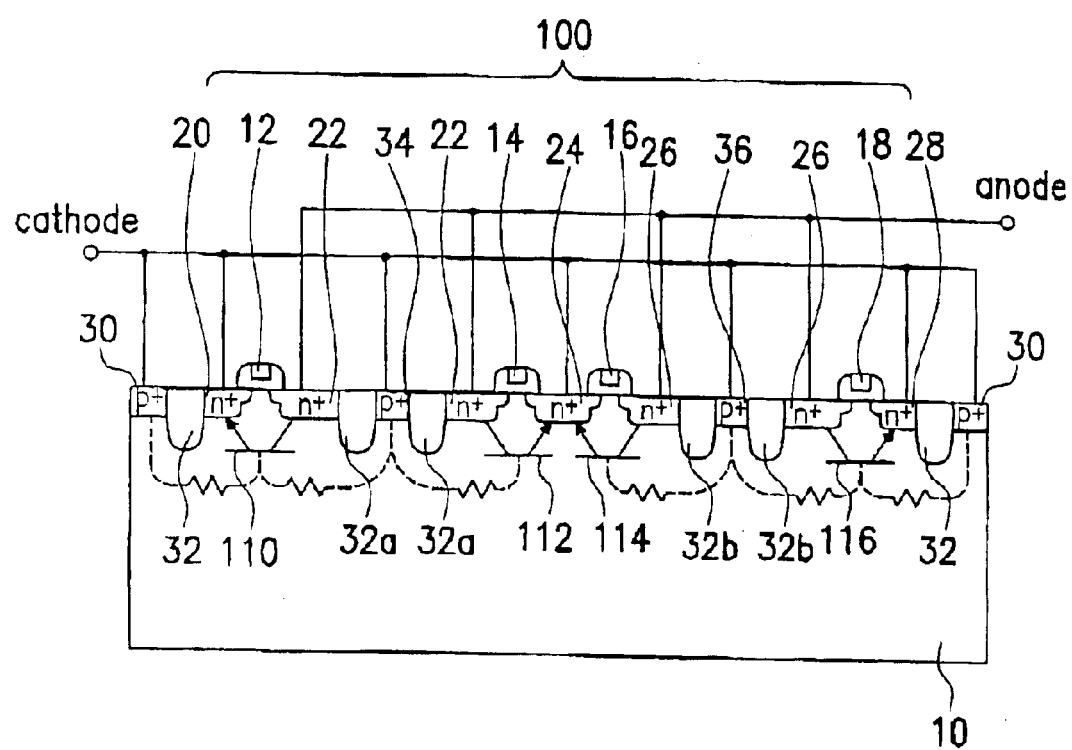
FIG. 7 is a cross-sectional view along line III–III' of FIGS. 5 and 6.

FIG. 5 is a top view showing an electrostatic discharge protection device fabricated according to a first embodiment of this invention. FIG. 6 is a top view showing an alternative electrostatic discharge protection device fabricated according the first embodiment of this invention. FIG. 7 is a cross-sectional view along line III–III' of FIG. 5.

Figure 2:
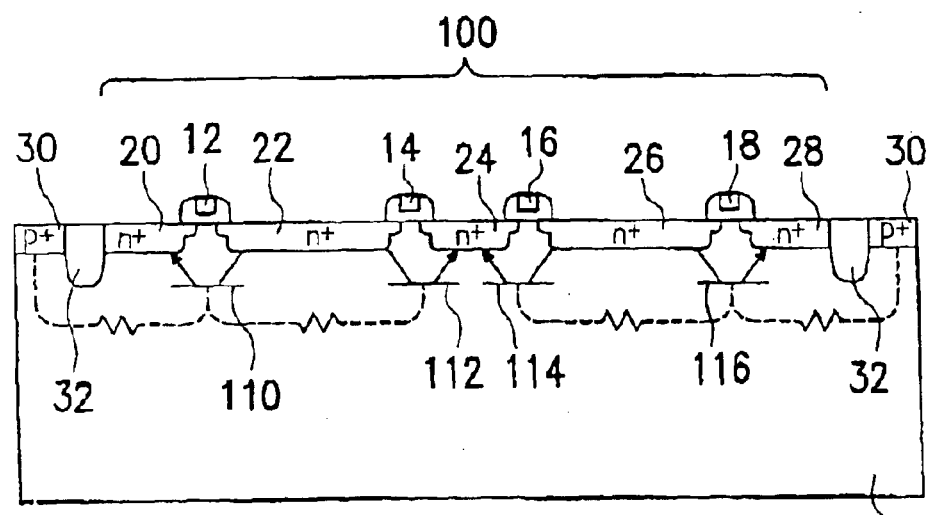
FIG. 2 is a cross-sectional view along line I–I' of FIG. 1.
Figure 3:
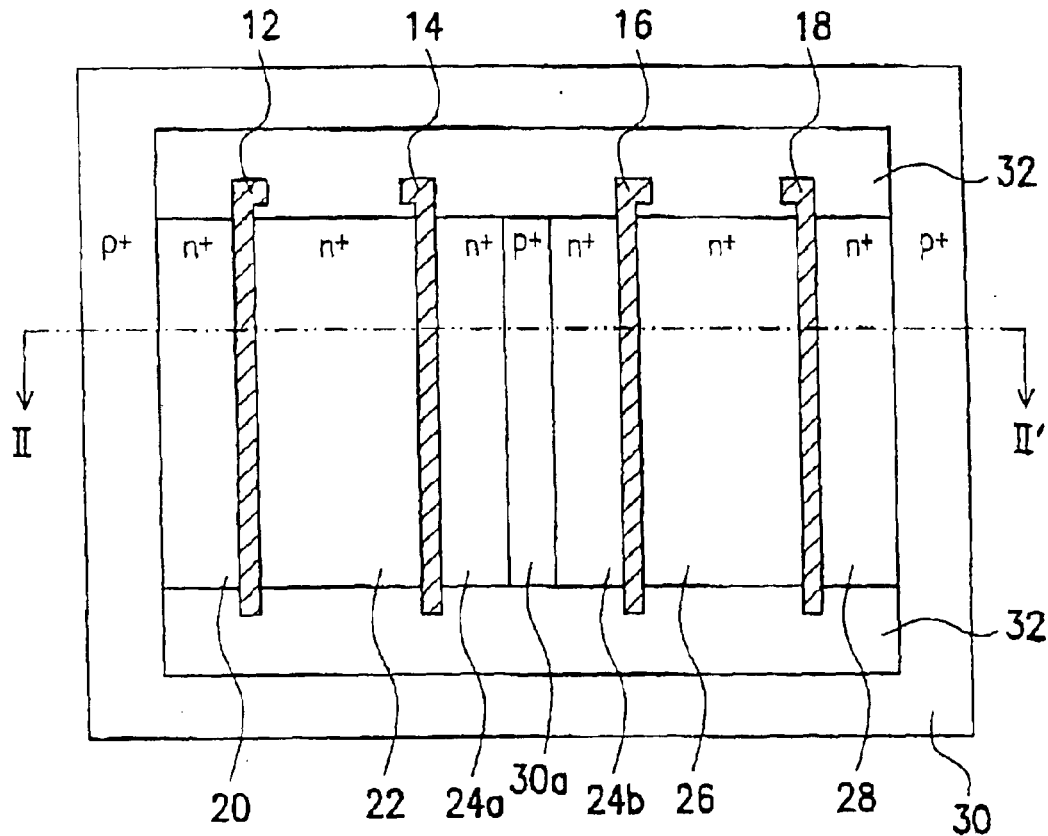
FIG. 3 is a top view of a conventional electrostatic discharge protection device having an improved structure for countering non-uniform switching of parasitic devices.
Figure 4:
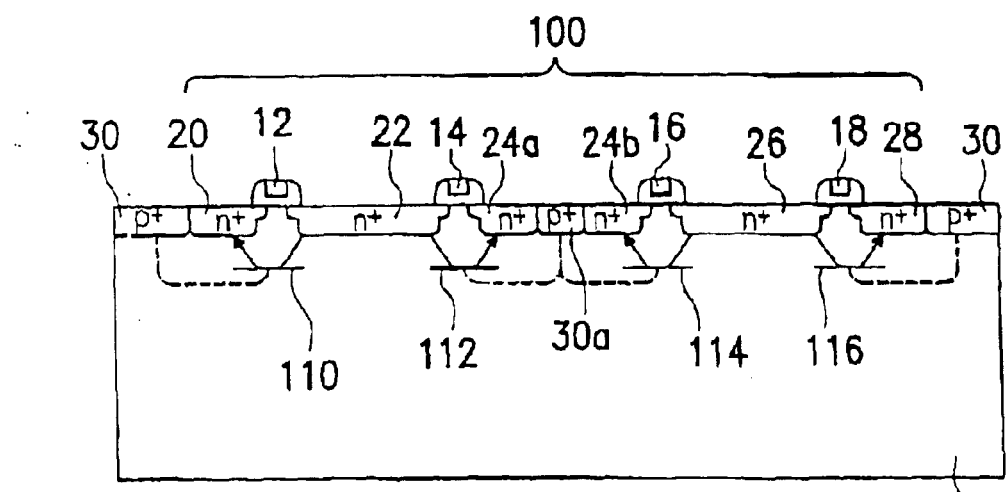
FIG. 4 is a cross-sectional view along line II–II' of FIG. 3.

As shown in FIGS. 5 and 7, the ESD protection device includes a metal-oxide-semiconductor (MOS) transistor region 100, a P+-doped guard ring 30, a shallow trench isolation (STI) region 32 and a pair of longitudinal P+-doped regions 34 and 36 formed on a P-type substrate 10. The MOS transistor region 100 accommodates a plurality of NMOS structures having gate terminals 12, 14, 16, 18, source terminals 20, 24, 28 and drain terminals 22, 26. Since the positioning of these gate, source and drain terminals is similar to the ones in FIGS. 1 and 2, detailed description of them is omitted. In this embodiment, four NMOS structures in the MOS transistor region 100 are as an example. The MOS transistor region 100 can also accommodates more than four NMOS structures for forming a multi-fingers structure. The P+-doped guard ring 30 circumscribes the substrate 10. The STI region 32 is formed between the P+-doped guard ring 30 and the MOS transistor region 100 as well as within the MOS transistor region 100.

A longitudinal P+-doped region 34 is inserted in the source terminal 22 between the gate terminal 12 and the gate terminal 14. The longitudinal P+-doped region 34 is isolated from the source terminal 22 by a circumscribing shallow trench isolation region 32a. Similarly, another longitudinal P+-doped region 36 is inserted in the source terminal 26 between the gate terminal 16 and the gate terminal 18. The longitudinal P+-doped region 36 is isolated from the source terminal 26 by a circumscribing shallow trench isolation region 32b.

In an alternative ESD protection device design as shown in FIGS. 6 and 7, the ESD protection device includes a metal-oxide-semiconductor (MOS) transistor region 100, a P+-doped guard ring 30, a shallow trench isolation (STI) region 32 and a pair of longitudinal P+-doped regions 34 and 36 formed on a P-type substrate 10. The MOS transistor region 100 accommodates a plurality of NMOS structures having gate terminals 12, 14, 16, 18, source terminals 20, 24, 28 and drain terminals 22, 26. Since the positioning of these gate, source and drain terminals is similar to the ones in FIGS. 1 and 2, detailed description of them is omitted. The P+-doped guard ring 30 circumscribes the substrate 10. The STI region 32 is formed between the P+-doped guard ring 30 and the MOS transistor region 100 as well as within the MOS transistor region 100.

The source region 22 between the gate terminal 12 and the gate terminal 14 is divided into a source region 22a and another source region 22b by the STI region 32. The longitudinal P+-doped region 34 is formed between the source region 22a and the source region 22b. The longitudinal P+-doped region 34 is isolated from the source regions 22a and 22b by the STI region 32. Similarly, the source region 26 between the gate terminal 16 and the gate terminal 18 is divided into a source region 26a and another source region 26b by the STI region 32. The longitudinal P+-doped region 36 is formed between the source region 26a and the source region 26b. The longitudinal P+-doped region 36 is isolated from the source regions 26a and 26b by the STI region 32.

The P+-doped guard ring 30, the longitudinal P+-doped regions 34, 36 and the source terminals 20, 24, 28 are all connected to a cathode terminal by using several contacts 30c, 34c, 36c, 20c, 24c, 28c. The drain terminals 22, 26 are connected to an anode terminal by using several contacts 22c, 26c. Especially, the P+-doped guard ring 30, the longitudinal P+-doped regions 34, 36 and the source terminals 20, 24, 28 are all connected to the cathode terminal, but the longitudinal P+-doped regions 34, 36 not to be connected to a substrate triggered circuit.

The ESD protection device in the first embodiment of this invention has a rather symmetrical design. Further, the P+-doped guard ring 30, the longitudinal P+-doped regions 34, 36 and all the source terminals 20, 24, 28 are electrically connected to each other. The base resistance of the parasitic bipolar transistor 110, 112, 114 and 116 can be increased, and the parasitic bipolar transistors 110, 112, 114 and 116 each have identical base resistance values.

Figure 8:
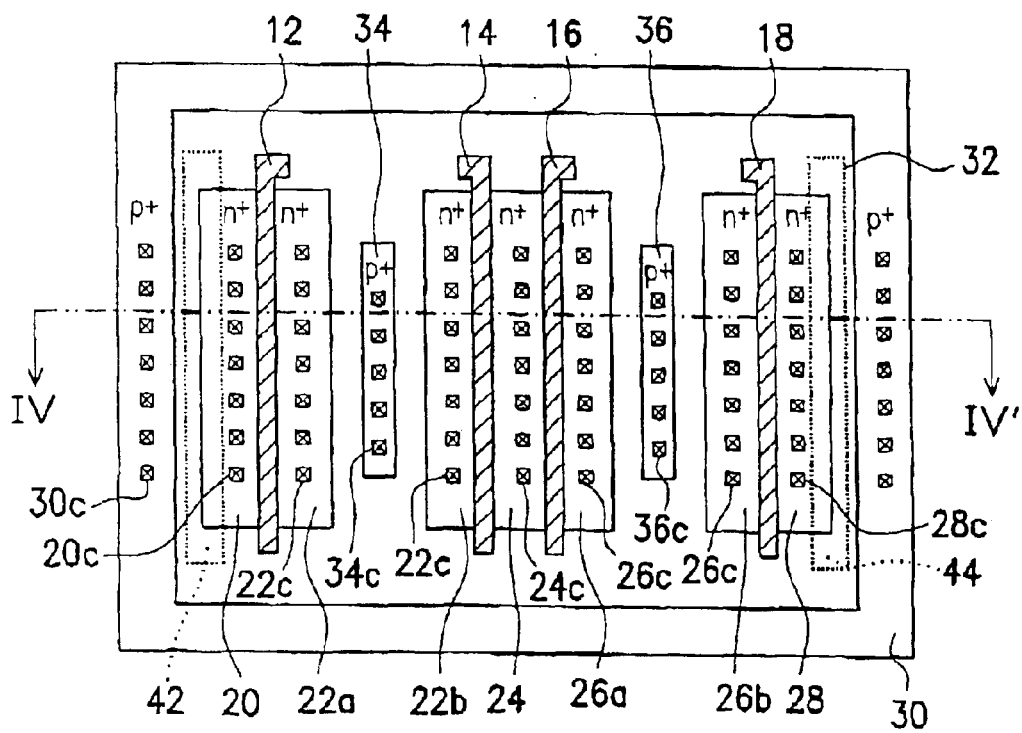
FIG. 8 is a top view showing an electrostatic discharge protection device fabricated according to a second embodiment of this invention.
Figure 9:
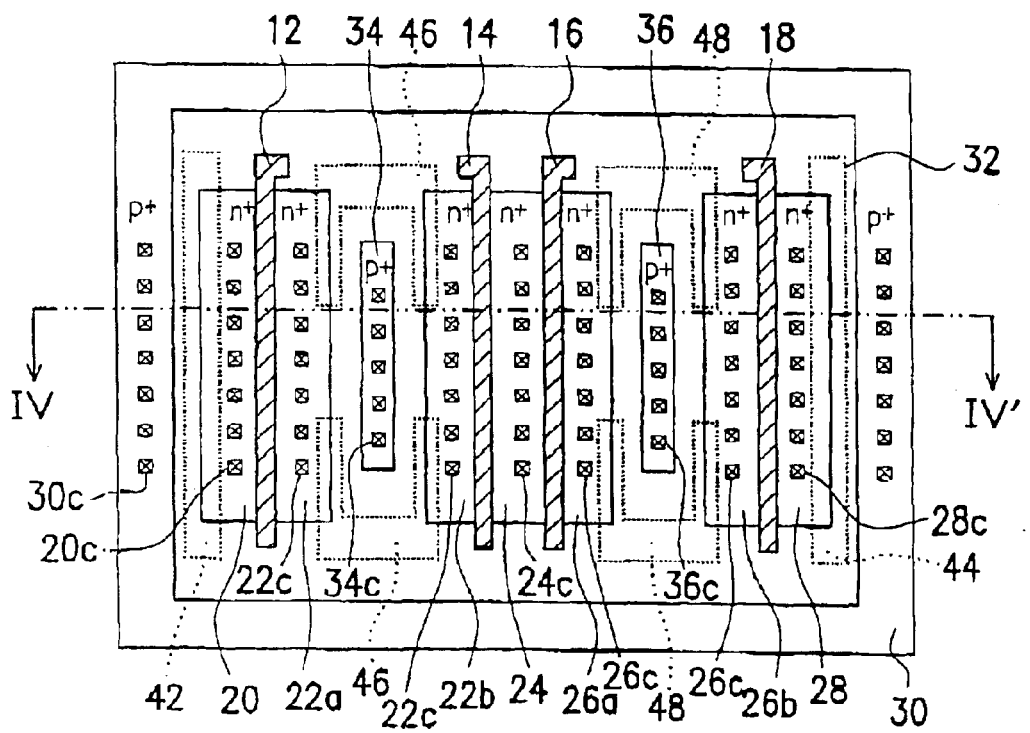
FIG. 9 is a top view showing an alternative electrostatic discharge protection device fabricated according the second embodiment of this invention.
Figure 10:
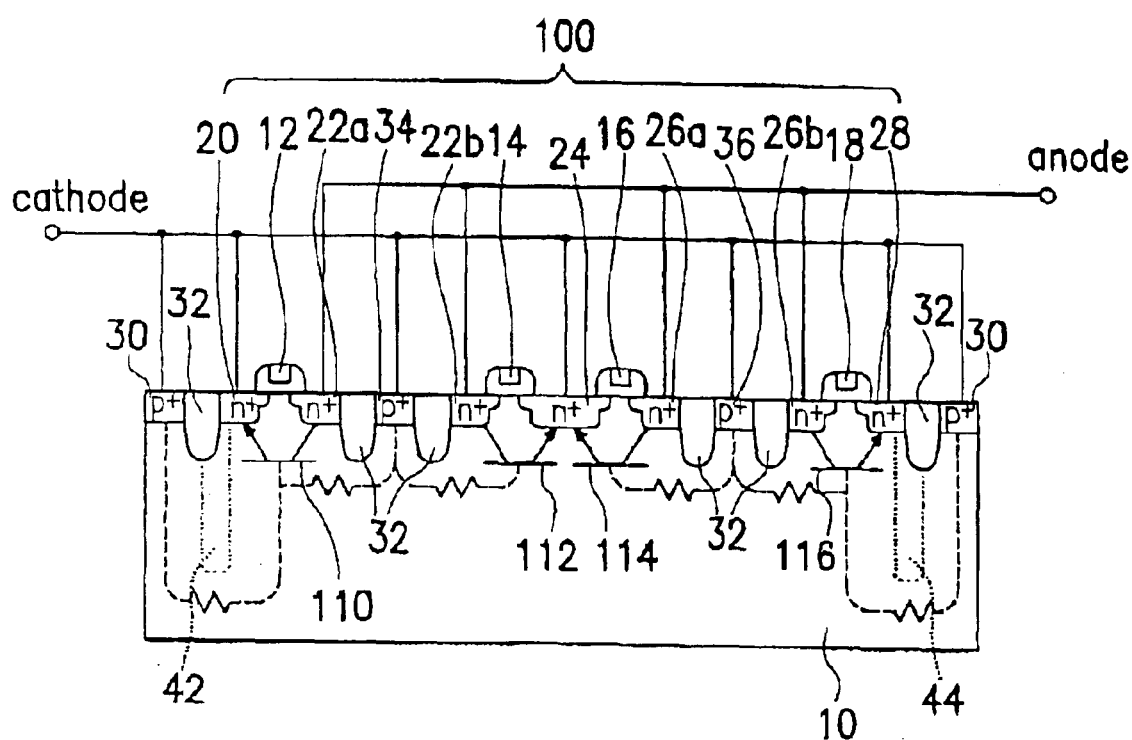
FIG. 10 is a cross-sectional view along line IV–IV' of FIGS. 8 and 9.

FIG. 8 is a top view showing an electrostatic discharge protection device fabricated according to a second embodiment of this invention. FIG. 9 is a top view showing an alternative electrostatic discharge protection device fabricated according the second embodiment of this invention. FIG. 10 is a cross-sectional view along line IV–IV' of FIGS. 8 and 9.

As shown in FIGS. 8 and 10, the ESD protection device includes a metal-oxide-semiconductor (MOS) transistor region 100, a P+-doped guard ring 30, a pair of longitudinal P+-doped regions 34, 36, a shallow trench isolation (STI) region 32 and a pair of N-doped wells 42, 44 formed on a P-type substrate 10. Since the positioning of the gate terminals 12, 14, 16, 18, source terminals 20, 24, 28 and drain terminals 22a, 22b, 26a, 26b within the MOS transistor region 100 as well as the P+-doped guard ring 30, the STI region 32 and the longitudinal P+-doped regions 34, 36 has already been explained with reference to FIGS. 6 and 7, detailed description of them is omitted. In the same way, four NMOS structures in the MOS transistor region 100 are as an example. The MOS transistor region 100 can also accommodates more than four NMOS structures for forming a multi-fingers structure.

In the second embodiment of this invention, longitudinal N-doped wells 42, 44 are formed in the substrate 10 on each side of the ESD protection device. The wells 42, 44 are positioned interior to the guard ring 30 adjacent to a strip of STI region 32. In other words, the longitudinal N-doped wells 42 and 44 are formed within the substrate 10 underneath the respective source terminals 20 and 28 and adjacent STI regions 32 (as shown in FIG. 10).

In the second embodiment, the P+-doped guard ring 30, the longitudinal P+-doped regions 34, 36 and the source terminals 20, 24, 28 are all connected to a cathode terminal by using several contacts 30c, 34c, 36c, 20c, 24c, 28c. The drain terminals 22, 26 are connected to an anode terminal by using several contacts 22c, 26c. Especially, the P+-doped guard ring 30, the longitudinal P+-doped regions 34, 36 and the source terminals 20, 24, 28 are all connected to the cathode terminal, but the longitudinal P+-doped regions 34, 36 not to be connected to a substrate triggered circuit.

The alternative ESD protection device design in FIGS. 9 and 10, aside from the aforementioned MOS transistor region 100, the P+-doped guard ring 30, the STI region 32, the longitudinal P+-doped regions 34, 36 and the longitudinal N-doped wells 42, 44, further includes a pair of U-shaped N-doped wells 46 between the drain terminals 22a and 22b. The N-doped wells 46 are formed symmetrically at each end of the longitudinal P+-doped region 34. Similarly, a pair of U-shaped N-doped wells 48 is also formed between the drain terminals 26a and 26b. The N-doped wells 48 are formed symmetrically at each end of the longitudinal P+-doped region 36.

Figure 11:
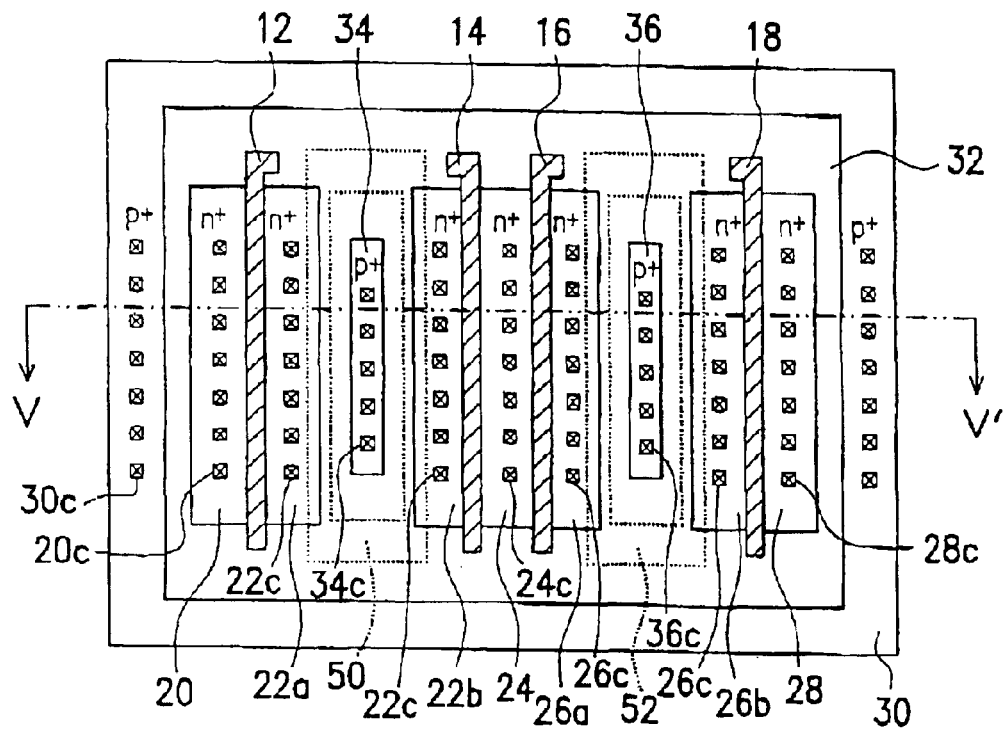
FIG. 11 a top view showing an electrostatic discharge protection device fabricated according to a third embodiment of this invention.

To minimize uneven conduction due to a non-symmetrical side MOS transistor structure, N-doped wells 42, 44, 46, 48 are formed inside the guard ring 30 as shown in FIGS. 8 and 9 having a cross-sectional structure as shown in FIG. 10 in a CMOS process. In this way, the base resistance of the parasitic bipolar transistors 110, 116 on each side of the device is connected in parallel with another resistor. In addition, the N-doped wells 46 between the drain terminals 22a and 22b and at the ends of the longitudinal P+-doped region 34 as well as the N-doped wells 48 between the drain terminals 26a and 26b and at the ends of the longitudinal P+-doped region 36 as shown in FIG. 11 increase the parasitic resistance values at both ends of the finger structure. Therefore, all the parasitic bipolar transistors are switched on concurrently and uniformly.

Figure 12:
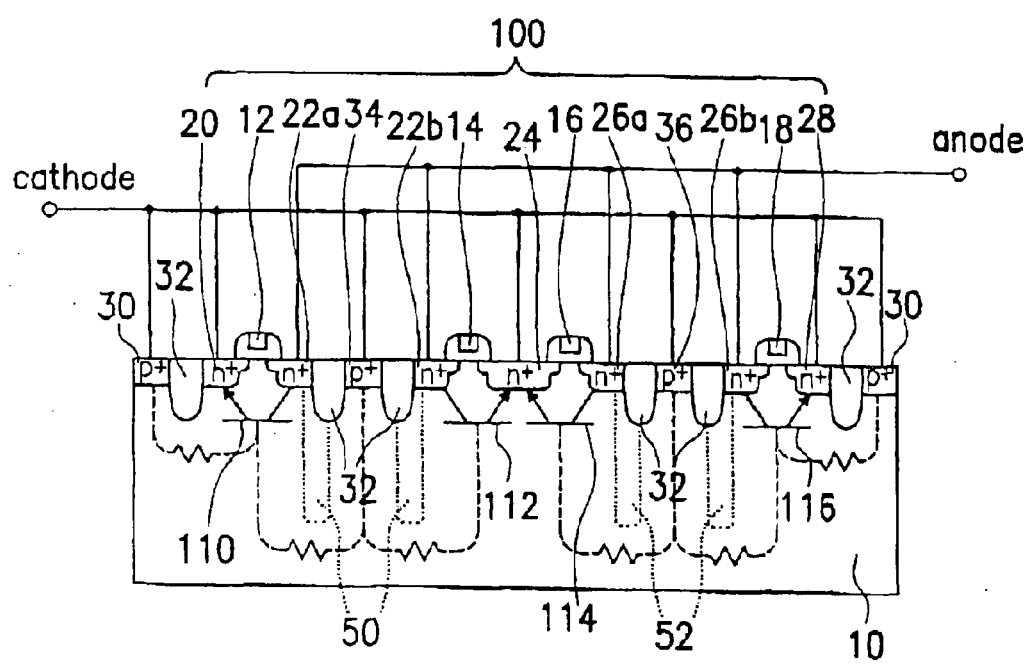
FIG. 12 is a cross-sectional view along line V–V' of FIG. 11.

FIG. 11 a top view showing an electrostatic discharge protection device fabricated according to a third embodiment of this invention. FIG. 12 is a cross-sectional view along line V–V' of FIG. 11.

As shown in FIGS. 11 and 12, the ESD protection device includes a metal-oxide-semiconductor (MOS) transistor region 100, a P+-doped guard ring 30, a pair of longitudinal P+-doped regions 34, 36, a shallow trench isolation (STI) region 32 and a pair of N-doped well regions 50, 52 formed on a P-type substrate 10. Since the positioning of the gate terminals 12, 14, 16, 18, source terminals 20, 24, 28 and drain terminals 22a, 22b, 26a, 26b within the MOS transistor region 100 as well as the P+-doped guard ring 30, the STI region 32 and the longitudinal P+-doped regions 34, 36 has already been explained with reference to FIGS. 6 and 7, detailed description of them is omitted. In the same way, four NMOS structures in the MOS transistor region 100 are as an example. The MOS transistor region 100 can also accommodates more than four NMOS structures for forming a multi-fingers structure.

In the third embodiment, a ring of N-doped well 50 is formed in the substrate 10 underneath the drain terminals 22a, 22b and adjacent to the STI region 32. The ring of N-doped well 50 circumscribes the longitudinal P+-doped region 34. Similarly, a ring of N-doped well 52 is formed in the substrate 10 underneath the drain terminals 26a, 26b and adjacent to the STI region 32. The ring of N-doped well 52 circumscribes the longitudinal P+-doped region 36.

The guard ring 30, the longitudinal P+-doped regions 34, 36 and the source terminals 20, 24, 28 are all connected to a cathode terminal by using several contacts 30c, 34c, 36c, 20c, 24c, 28c. The drain terminals 22, 26 are connected to an anode terminal by using several contacts 22c, 26c. Especially, the P+-doped guard ring 30, the longitudinal P+-doped regions 34, 36 and the source terminals 20, 24, 28 are all connected to the cathode terminal, but the longitudinal P+-doped regions 34, 36 not to be connected to a substrate triggered circuit.

With a suitable layout as shown in FIG. 12, the parasitic bipolar transistors 110, 112, 114, 116 all have a greater base resistance value. Hence, this type of design is able to improve overall switching capacity of the device.

Figure 13:
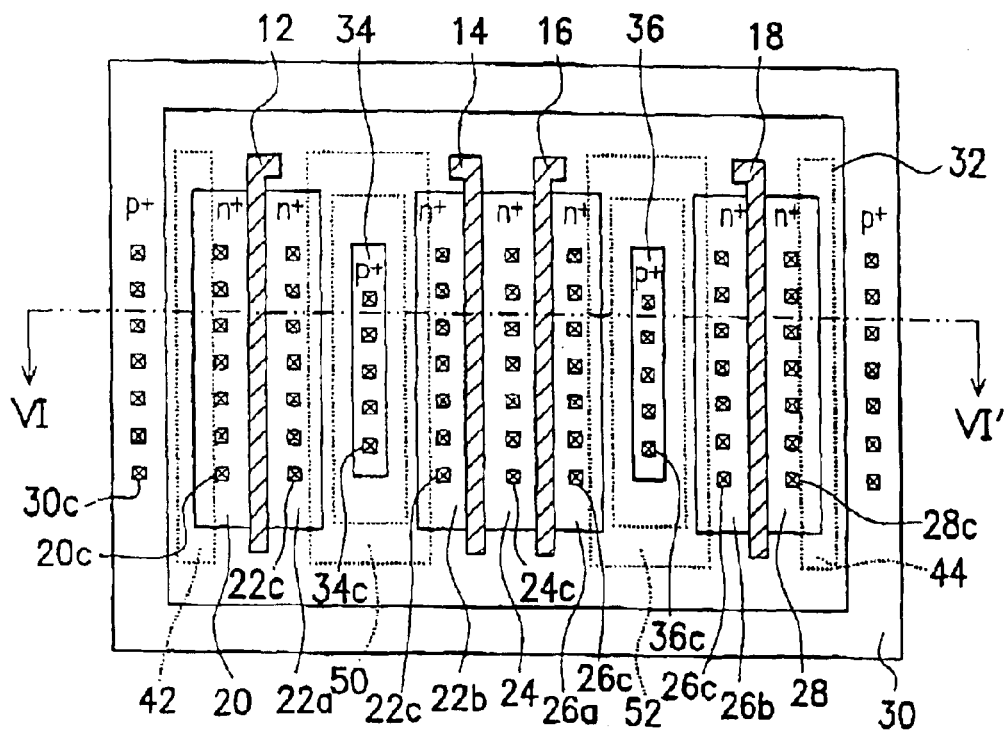
FIG. 13 is a top view showing an electrostatic discharge protection device fabricated according to a fourth embodiment of this invention.
Figure 14:
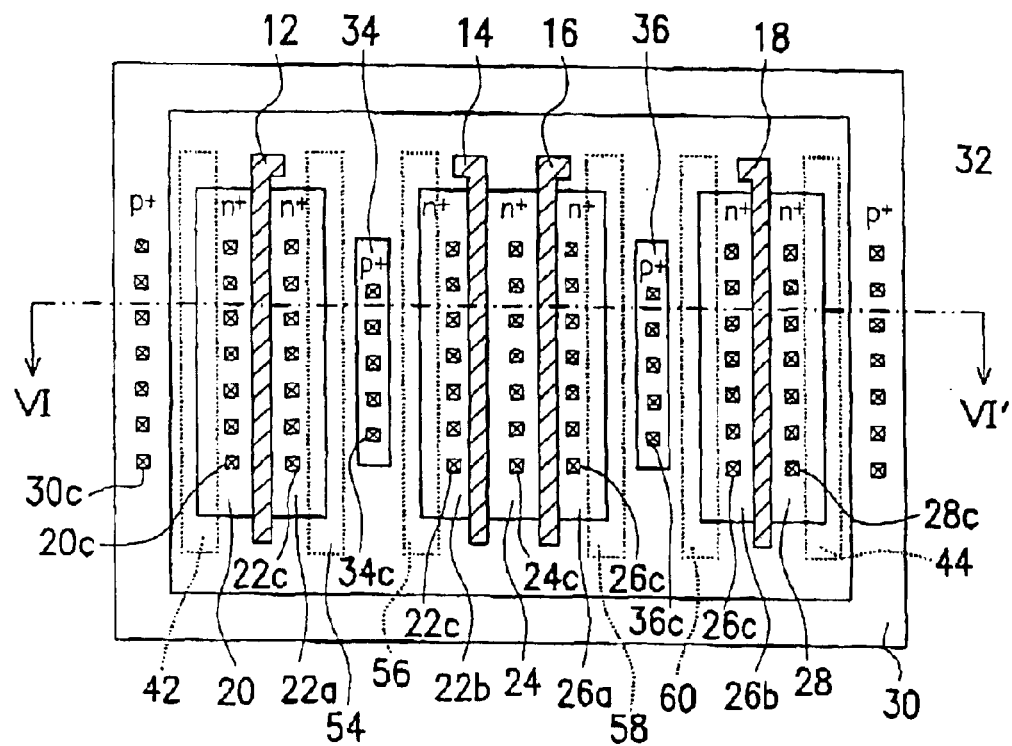
FIG. 14 is a top view showing an alternative electrostatic discharge protection device fabricated according the fourth embodiment of this invention.
Figure 15:
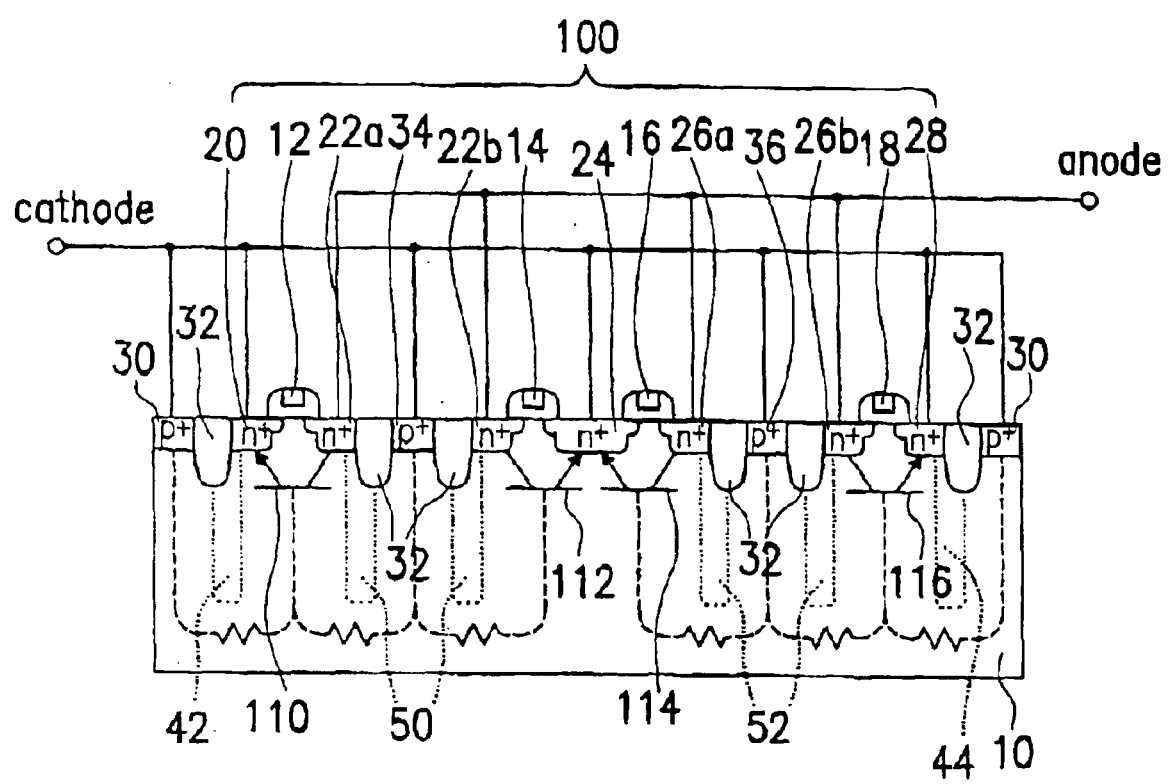
FIG. 15 is a cross-sectional view along line VI–VI' of FIGS. 13 and 14.

FIG. 13 is a top view showing an electrostatic discharge protection device fabricated according to a fourth embodiment of this invention. FIG. 14 is a top view showing an alternative electrostatic discharge protection device fabricated according the fourth embodiment of this invention. FIG. 15 is a cross-sectional view along line VI–VI' of FIGS. 13 and 14

As shown in FIGS. 13 and 15, the ESD protection device includes a metal-oxide-semiconductor (MOS) transistor region 100, a P+-doped guard ring 30, a pair of longitudinal P+-doped regions 34, 36, a shallow trench isolation (STI) region 32, a pair of N-doped well regions 42, 44 and a pair of ring-like N-doped wells 50, 52 formed on a P-type substrate 10. Since the positioning of the gate terminals 12, 14, 16, 18, source terminals 20, 24, 28 and drain terminals 22a, 22b, 26a, 26b within the MOS transistor region 100 as well as the P+-doped guard ring 30, the STI region 32 and the longitudinal P+-doped regions 34, 36 has already been explained with reference to FIGS. 6 and 7, detailed description of them is omitted. In the same way, four NMOS structures in the MOS transistor region 100 are as an example. The MOS transistor region 100 can also accommodates more than four NMOS structures for forming a multi-fingers structure.

In the fourth embodiment, the longitudinal N-doped wells 42 and the longitudinal N-doped wells 44 are formed in the substrate 10 on each side of the ESD protection device. The N-doped wells 42 and 44 are positioned just inside the guard ring 30 following the contour of the STI region 32. As shown in FIG. 15, the longitudinal N-doped wells 42 and 44 are formed within the substrate 10 between the respective source terminals 20, 28 and the STI region 32. Furthermore, the ring-like N-doped well 50 is formed between the drain terminals 22a and 22b enclosing the longitudinal P+-doped region 34 while the ring-like N-doped well 52 is formed between the drain terminals 26a and 26b enclosing the longitudinal P+-doped region 36.

The guard ring 30, the longitudinal P+-doped regions 34, 36 and the source terminals 20, 24, 28 are all connected to a cathode terminal by using several contacts 30c, 34c, 36c, 20c, 24c, 28c. The drain terminals 22, 26 are connected to an anode terminal by using several contacts 22c, 26c. Especially, the P+-doped guard ring 30, the longitudinal P+-doped regions 34, 36 and the source terminals 20, 24, 28 are all connected to the cathode terminal, but the longitudinal P+-doped regions 34, 36 not to be connected to a substrate triggered circuit.

The alternative ESD protection device design in FIGS. 14 and 15, aside from the aforementioned MOS transistor region 100, the P+-doped guard ring 30, the STI region 32, the longitudinal P+-doped regions 34, 36 and the longitudinal N-doped wells 42, 44, further includes a longitudinal N-doped well region 54 between the drain terminal 22a and the longitudinal P+-doped region 34. The longitudinal N-doped well region 54 is formed within the substrate 10 underneath the drain terminal 22a and adjacent STI region 32. Similarly, the ESD protection device further includes a longitudinal N-doped well region 56 between the drain terminal 22b and the longitudinal P+-doped region 34. The longitudinal N-doped well region 56 is formed within the substrate 10 underneath the drain terminal 22b and adjacent STI region 32. The ESD protection device also includes a longitudinal N-doped well region 58 between the drain terminal 26a and the longitudinal P+-doped region 36. The longitudinal N-doped well region 58 is formed within the substrate 10 underneath the drain terminal 26a and adjacent STI region 32. Similarly, the ESD protection device further includes a longitudinal N-doped well region 60 between the drain terminal 26b and the longitudinal P+-doped region 36. The longitudinal N-doped well region 60 is formed within the substrate 10 underneath the drain terminal 26b and adjacent STI region 32.

The ESD protection device in the fourth embodiment is actually a design that combines the characteristics of the second and the third embodiment. In other words, the fourth embodiment includes both N-doped wells on each side of the device and ring-like N-doped wells in the interior. To provide a better symmetry for the device, the N-doped wells are positioned at suitable positions just inside the guard ring as shown in FIGS. 13 and 14 with a cross-sectional structure as shown in FIG. 15. In this way, each of the parasitic bipolar transistors 110, 112, 114, 116 has a greater but identical base resistance value. Thus, all the parasitic bipolar transistors 110, 112, 114, 116 have identical but improved switching capacity.

In conclusion, major advantages of this invention include:

1. The ESD protection device has a longitudinal doped region within the drain terminal of the MOS transistor, and the longitudinal doped region and the source terminal MOS transistor are connected to a cathode terminal. Hence, the base resistance of the parasitic bipolar transistor of each MOS transistor can be increased and has equal switching power.

2. The ESD protection device has a longitudinal doped region inside the drain terminal of the MOS transistor and deep well in the appropriate region, wherein the longitudinal doped region and the source terminal MOS transistor are connected to a cathode terminal. Hence, the parasitic bipolar transistor of each MOS transistor has an identical and improved switching capability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection device, comprising:
   a substrate;
   at least a first parasitic bipolar transistor within the substrate, wherein the first parasitic bipolar transistor includes a first emitter terminal, a first collector terminal and a first base terminal;
   at least a second parasitic bipolar transistor within the substrate, wherein the second parasitic bipolar transistor includes a second emitter terminal, a second collector terminal and a second base terminal, and the second collector terminal is adjacent to the first collector terminal;
   a first longitudinal doped region between the first collector terminal and the second collector terminal;
   at least a third parasitic bipolar transistor within the substrate, wherein the third parasitic bipolar transistor includes a third emitter, a third collector and a third base, and the third emitter and the second emitter are connected;
   at least a fourth parasitic bipolar transistor within the substrate, wherein the fourth parasitic bipolar transistor includes a fourth emitter, a fourth collector and a fourth base, and the fourth collector is adjacent to the third collector, the first/second/third/fourth collectors are connected to an anode terminal;
   a second longitudinal doped region between the fourth collector and the third collector;
   a guard ring circumscribing the substrate, wherein the guard ring, the first/second longitudinal doped regions and the first/second/third/fourth emitters are connected to a cathode terminal, wherein the first/second longitudinal doped regions are not connected to a substrate triggered circuit; and
   an isolation region inside the guard ring for isolating the first/second/third/fourth parasitic bipolar transistor from the guard ring, the first collector, the first longitudinal doped region and the second collector from each other as well as the third collector, the second longitudinal doped region and the fourth collector from each other.

2. The ESD protection device of claim 1, wherein the device further includes a well region in the substrate underneath the first emitter terminal and adjacent isolation region and another well region in the substrate underneath the fourth emitter terminal and adjacent isolation region.

3. The ESD protection device of claim 1, wherein the device further includes a well region in the substrate underneath the first collector terminal, the second collector terminal and adjacent isolation region and another well region in the substrate underneath the third collector terminal, the fourth collector terminal and adjacent isolation region.

4. The ESD protection device of claim 1, wherein the device further includes:
   a first well region in the substrate underneath the first emitter terminal and adjacent isolation region as well as in the substrate underneath the fourth emitter terminal and adjacent isolation region; and
   a second well region in the substrate underneath the first collector terminal, the second collector terminal and adjacent isolation region as well as in the substrate underneath the third collector terminal, the fourth collector terminal and adjacent isolation region.

5. The ESD protection device of claim 1, wherein the device further includes a first metal-oxide-semiconductor (MOS) transistor in the substrate, the first MOS transistor has a gate terminal, a source terminal and a drain terminal such that the source terminal is the first emitter and the drain terminal is the first collector.

6. The ESD protection device of claim 1, wherein the device further includes a second MOS transistor in the substrate, the second MOS transistor has a gate terminal, a source terminal and a drain terminal such that the source terminal is the second emitter and the drain terminal is the second collector.

7. The ESD protection device of claim 1, wherein the device further includes a third MOS transistor in the substrate, the third MOS transistor has a gate terminal, a source terminal and a drain terminal such that the source terminal is the third emitter and the drain terminal is the third collector.

8. The ESD protection device of claim 1, wherein the device further includes a fourth MOS transistor in the substrate, the fourth MOS transistor has a gate terminal, a source terminal and a drain terminal such that the source terminal is the fourth emitter and the drain terminal is the fourth collector.

9. The ESD protection device of claim 1, wherein the guard ring is a ring of P+-doped region.

10. The ESD protection device of claim 1, wherein the first longitudinal doped region and the second longitudinal doped region are long and narrow P+-doped regions.

11. The ESD protection device of claim 1, wherein the first emitter terminal, the second emitter terminal, the third emitter terminal, the fourth emitter terminal, the first collector terminal, the second collector terminal, the third collector terminal and the fourth collector terminal are N+-doped regions respectively.

12. The ESD protection device of claim 1, wherein the isolation region includes a shallow trench isolation (STI) structure.

* * * * *